United States Patent
Hamura et al.

(10) Patent No.: US 6,287,482 B1
(45) Date of Patent: Sep. 11, 2001

(54) SEMICONDUCTOR DEVICE

(75) Inventors: Yoichiro Hamura, Hamura; Toshiaki Mori, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/501,242

(22) Filed: Feb. 10, 2000

(30) Foreign Application Priority Data

Feb. 10, 1999 (JP) .................................................. 11-032224

(51) Int. Cl.⁷ .................................................. H01L 27/10
(52) U.S. Cl. ........................... 252/202; 257/203; 257/208
(58) Field of Search .................................. 257/202, 203, 257/208; 438/128, 587, 598, 129

(56) References Cited

U.S. PATENT DOCUMENTS

| | | | |
|---|---|---|---|
| 4,809,029 | * 2/1989 | Matsumura et al. | 364/900 |
| 4,920,398 | * 4/1990 | Yoshio et al. | 257/203 |
| 4,945,395 | * 7/1990 | Suehiro | 257/786 |
| 5,300,796 | * 4/1994 | Shintani | 257/203 |
| 5,422,441 | * 6/1995 | Iruka | 174/250 |
| 5,552,618 | * 9/1996 | Taniguchi et al. | 257/207 |
| 5,903,019 | * 5/1999 | Watanabe | 257/208 |
| 5,917,206 | * 6/1999 | Takamori | 257/203 |
| 6,013,924 | * 1/2000 | Osajima et al. | 257/203 |
| 6,078,068 | * 6/2000 | Tamura | 257/203 |
| 6,091,089 | * 7/2000 | Hiraga | 257/203 |
| 6,130,484 | * 10/2000 | Kameda et al. | 257/786 |

FOREIGN PATENT DOCUMENTS

| | | | |
|---|---|---|---|
| 3-138972 | * 6/1991 | (JP) | 257/203 |
| 8-186176 | * 7/1996 | (JP) . | |
| 10-284611 | 10/1998 | (JP) . | |

* cited by examiner

*Primary Examiner*—Jhihan B Clark
(74) *Attorney, Agent, or Firm*—Oblon, Spivak, McClelland, Maier & Neustadt, P.C.

(57) ABSTRACT

There is herein disclosed a semiconductor device comprising an internal cell area 1 on which various logic circuits are formed, an I/O cell area 3 via which a signal is received/transmitted between a pad for connection to the outside and said internal cell area 1, an external pad area 2a formed outside the I/O cell area 3, and an internal pad area 2b formed between the internal cell area 1 and the I/O cell area 3. Since the internal pad area 2b is disposed not only outside the I/O cell area 3, but also between the I/O cell area 3 and the internal cell area 1, the number of pads for the connection to the outside can be increased more than that of a conventional art, and a large number of pins of a chip can be handled. Moreover, since a pad interval does not have to be narrowed, reliability is improved, and manufacture yield is raised.

12 Claims, 7 Drawing Sheets

▨ : INTERNAL PAD AREA

▧ : EXTERNAL PAD AREA

▨ : I/O CELL AREA

░ : INTERNAL CELL AREA

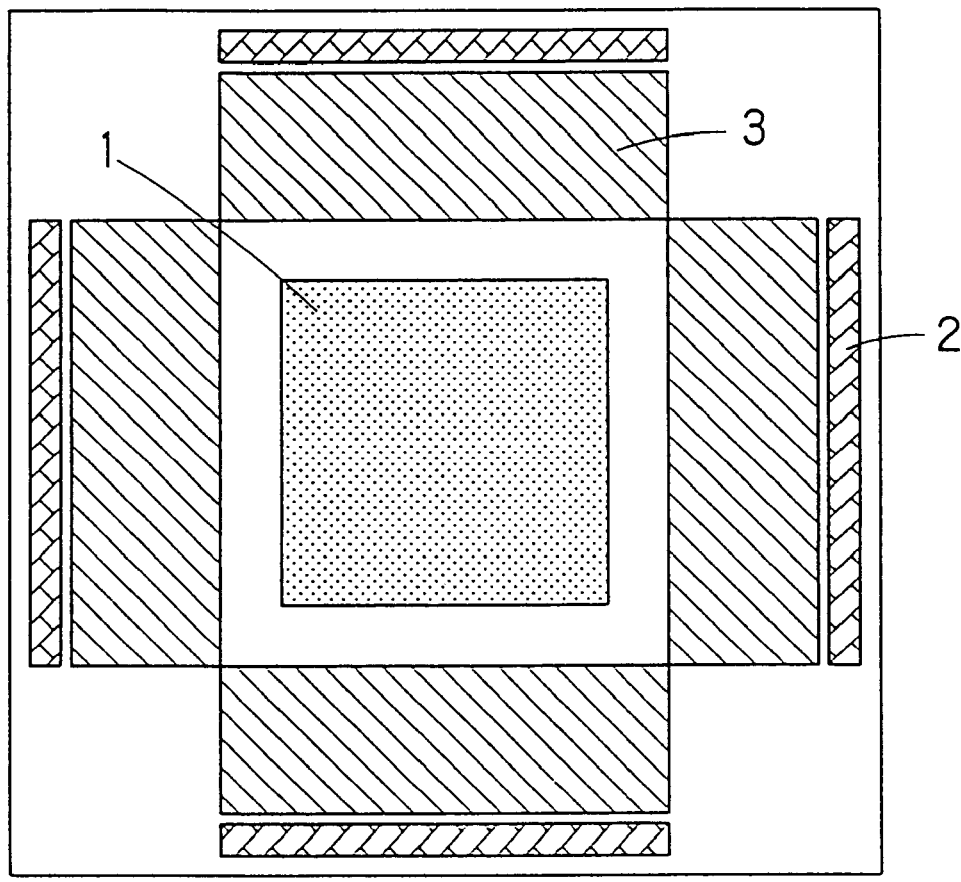
 : EXTERNAL PAD AREA
 : I/O CELL AREA
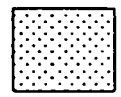 : INTERNAL CELL AREA
PRIOR ART F I G. 1

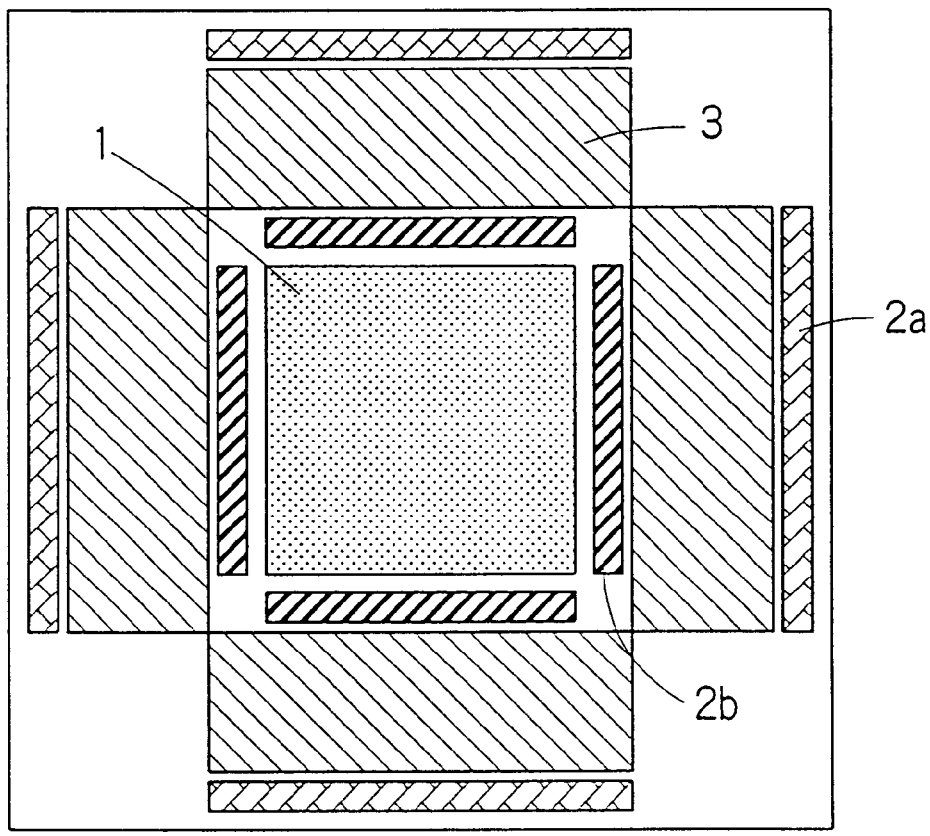
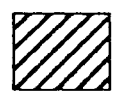 : INTERNAL PAD AREA
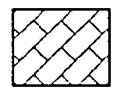 : EXTERNAL PAD AREA
 : I/O CELL AREA
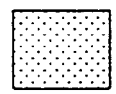 : INTERNAL CELL AREA
F I G. 2

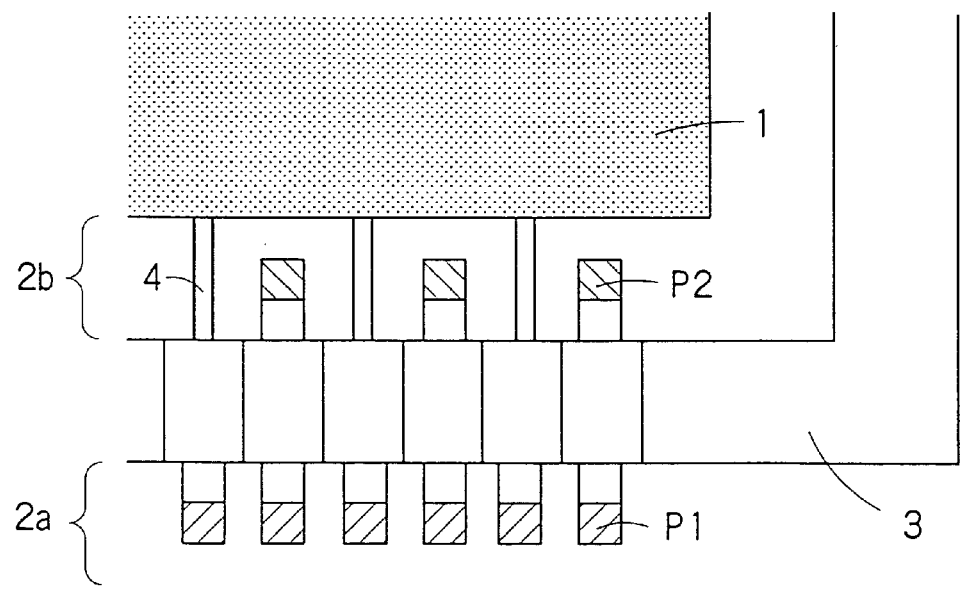
F I G. 3
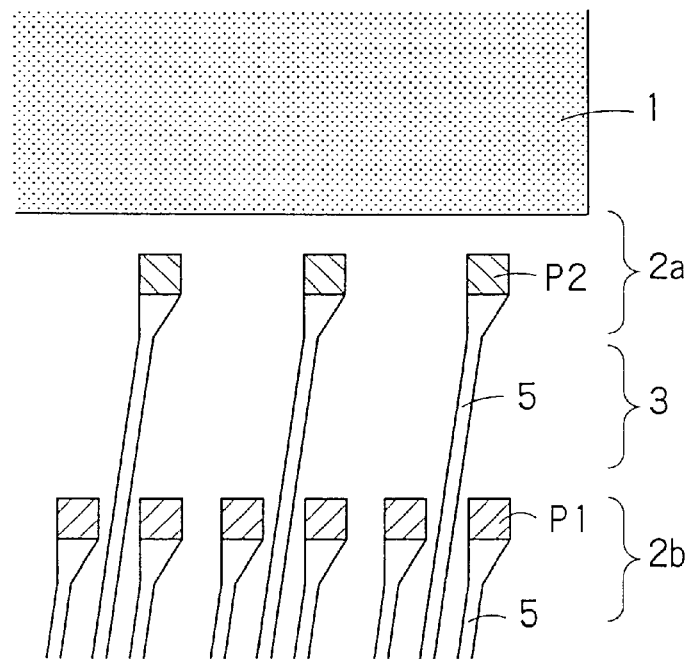
F I G. 4

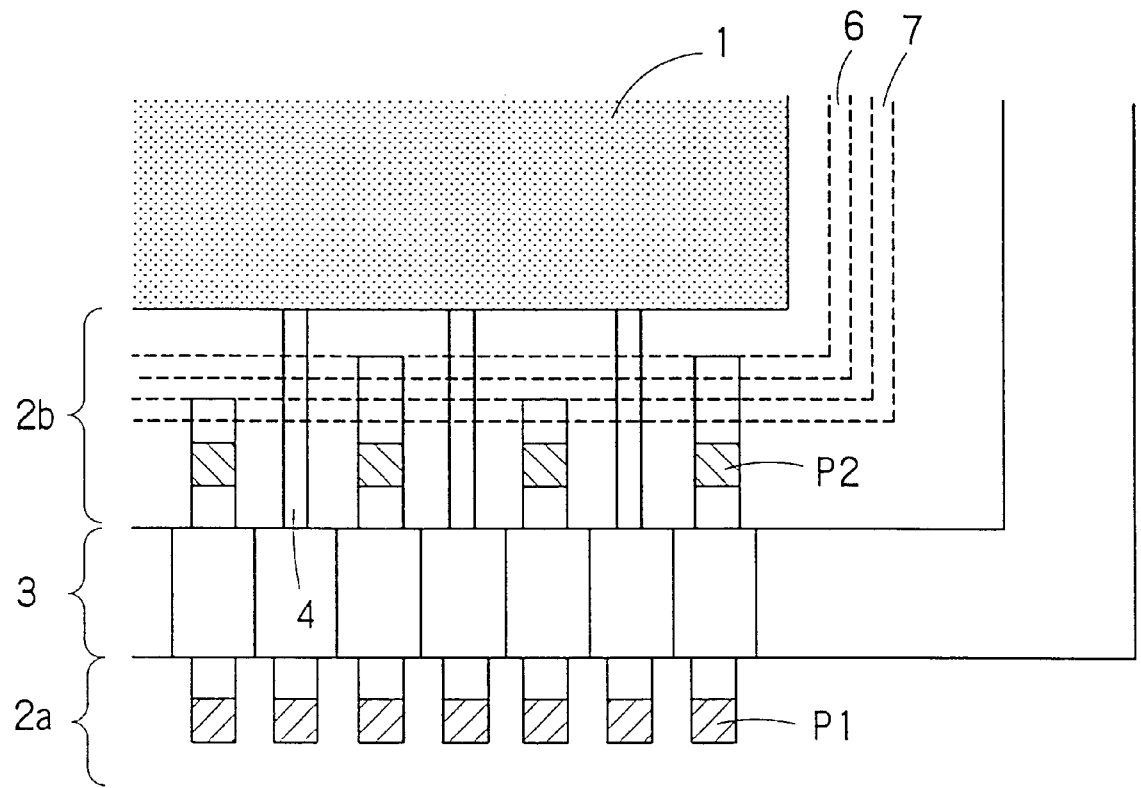
F I G. 6

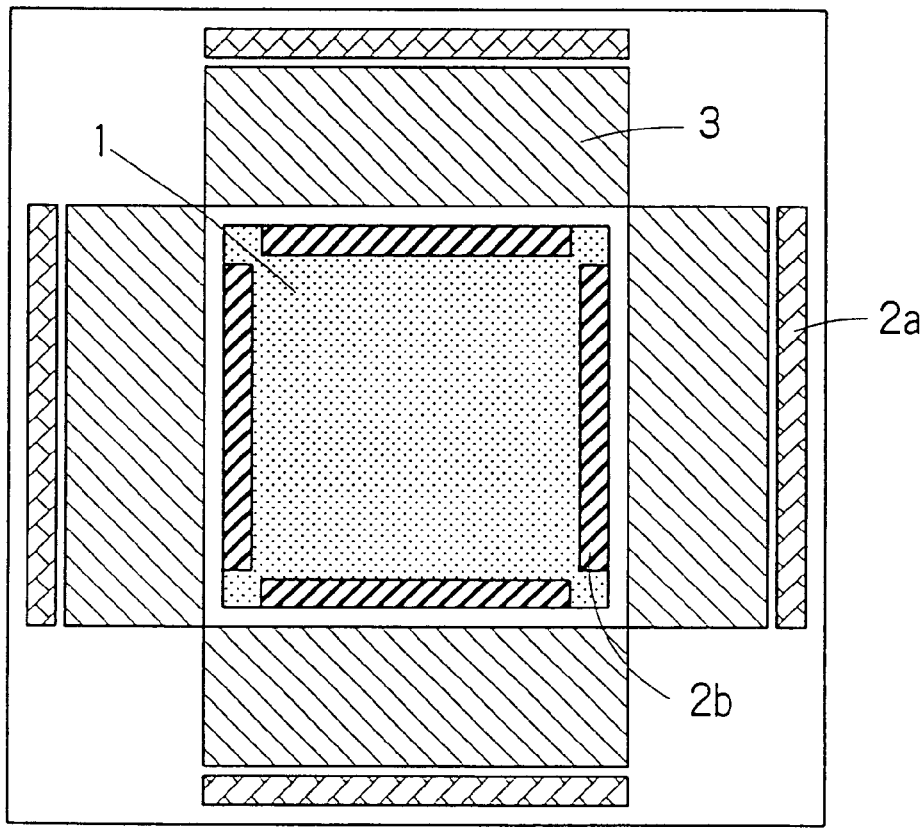
 : INTERNAL PAD AREA
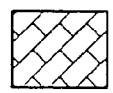 : EXTERNAL PAD AREA
 : I/O CELL AREA
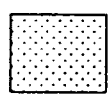 : INTERNAL CELL AREA
F I G. 9

SEMICONDUCTOR DEVICE

BACKGROUND OF THE INVENTION

1. Field of the Invention

The present invention relates to a master structure and a layout constitution of a gate array (GA) and an embedded array (EA).

2. Related Background Art

In recent years, with the popularization of portable electronic apparatuses such as notebook type computers, it has often been intended to reduce a packaging area by integrating peripheral circuits of CPU into one chip. Such a multifunctional chip is generally constituted using a gate array or an embedded array.

FIG. 1 is a layout diagram of a conventional gate array. The conventional gate array has an internal cell area 1 on which various logic circuits are formed, a pad area 2 connected to external wirings, and an I/O cell area 3 formed between the internal cell area 1 and the pad area 2. Each input/output terminal in the internal cell area 1 is connected to the corresponding pad in the pad area 2 through the I/O cell area 3.

In the pad area 2, a plurality of pads are formed at predetermined intervals. Each pad is connected to a corresponding external pin of a package (not shown) via a carrier tape (not shown).

The above-described multifunctional chip communicates with many kinds of external signals, and hence, a number of pads for external connection have to be disposed in the chip. In the conventional gate array, however, the pad area 2 is formed only on the outside periphery of the chip as shown in FIG. 1, so that the number of the pads cannot sufficiently be increased. Therefore, even when an empty space is present in the internal cell area 1 or the I/O cell area 3, there is a problem that the circuit cannot be formed because of the shortage of the pad area 2.

SUMMARY OF THE INVENTION

The present invention has been developed in consideration of the above-mentioned problem, and an object thereof is to provide a semiconductor device on which it is possible to form a number of pads for external connection.

To attain the above-described object, according to the present invention, there is provided a semiconductor device comprising:

an internal cell area on which various logic circuits can be formed;

a pad area on which a plurality of pads for connection to the outside are formed; and an I/O cell area for receiving/transmitting signals between the internal cell area and the pad area;

the pad area including:

an external pad area formed outside the I/O cell area; and an internal pad area formed between the internal cell area and the I/O cell area.

According to another aspect of the present invention, there is provided a semiconductor device comprising:

an internal cell area on which various logic circuits can be formed;

a pad area on which a plurality of pads for connection to the outside are formed; and an I/O cell area for receiving/transmitting signals between the internal cell area and the pad area;

the pad area including:

an external pad area formed outside the I/O cell area; and an internal pad area formed along an outer edge of the internal cell area and inside the internal cell area.

According to the present invention, since not only the pad area is disposed outside the I/O cell area, but also the internal pad area is disposed between the I/O cell area and the internal cell area, resulting in increase of the number of pins. Moreover, since a pad interval does not need to be narrowed, reliability is improved, and manufacture yield is raised.

Furthermore, since a wiring layer for connecting the internal pad area and the I/O cell area can be formed on the same layer (e.g., a third layer) as a wiring layer in the internal cell area, a new wiring layer for the internal pad area does not need to be disposed, resulting in simplification of a manufacture process.

BRIEF DESCRIPTION OF THE DRAWINGS

FIG. 1 shows a layout of a conventional gate array.

FIG. 2 shows a layout of a first embodiment of a gate array.

FIG. 3 is an enlarged view of a part of an external pad area 2a and an internal pad area 2b.

FIG. 4 is a diagram showing a carrier tape connected to a pad.

FIG. 6 is an enlarged view of a part of the gate array of FIG. 4.

FIG. 9 shows a layout of a second embodiment of the gate array.

DETAILED DESCRIPTION OF THE PREFERRED EMBODIMENTS

Figure 5:
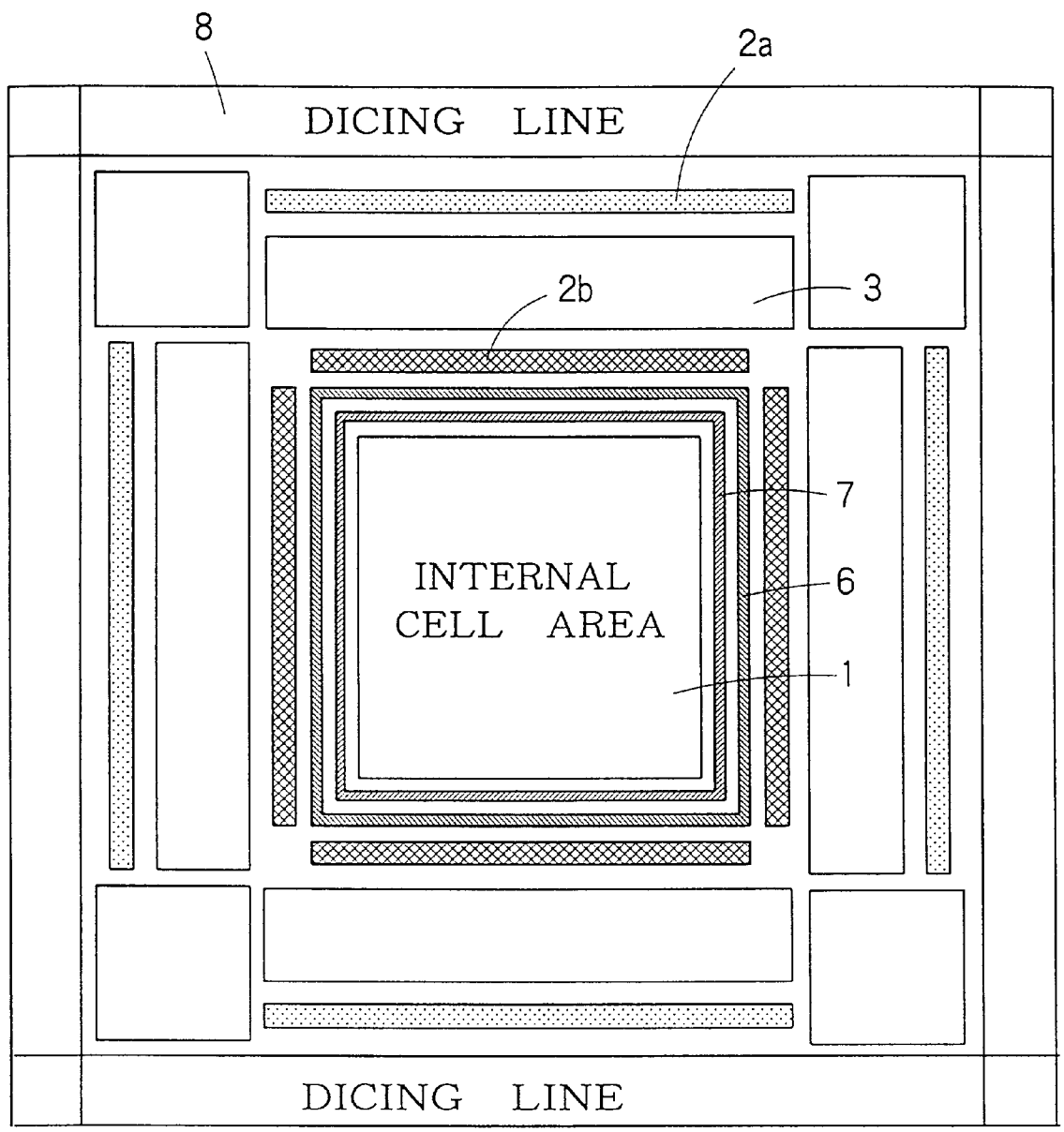
FIG. 5 is a diagram showing an example in which the pad in the internal pad area is used mainly for a power source/earth terminal.

An example in which a semiconductor device according to the present invention is applied to a gate array will specifically be described hereinafter with reference to the drawings.

(First Embodiment)

FIG. 2 shows a layout of a first embodiment of the gate array. The gate array of FIG. 2 includes an internal cell area 1 on which various logic circuits are formed, an I/O cell area 3 for receiving/transmitting signals between a pad for connection to the outside and the internal cell area 1, an external pad area 2a formed outside the I/O cell area 3, and an internal pad area 2b formed between the internal cell area 1 and the I/O cell area 3.

Specifically, the gate array of FIG. 2 is characterized in that the internal pad area 2b is newly disposed.

FIG. 3 is an enlarged view of a part of the external pad area 2a and internal pad area 2b. As shown in FIG. 3, a plurality of pads P1 and P2 are formed at predetermined intervals in each pad area 2, and the pad interval in the external pad area 2a is set to be narrower than the pad interval in the internal pad area 2b. The pad interval formed in the external pad area 2a is substantially the same as the conventional interval.

Moreover, both the pad areas 2a, 2b exchange signals with the internal cell area 1 via the I/O cell area 3. A wiring layer 4 for connecting the internal cell area 1 and the I/O cell area 3 is formed to pass between adjacent pads P2 in the internal pad area 2b.

When the gate array is packaged, the external pad area 2a and internal pad area 2b are connected to the external connection terminal (not shown) of a package via a carrier tape 5 as shown in FIG. 4.

FIG. 5 shows a layout of the gate array in which the pads in the internal pad area 2b are mainly utilized for a power source terminal and an earth terminal. In the gate array of FIG. 5, a power source layer (VDD layer) 6 and an ground layer (VSS layer) 7 are formed between the internal cell area 1 and the internal pad area 2b so as to surround the internal cell area 1. Moreover, a dicing line 8 for division by a chip unit is formed outside the external pad area 2a.

FIG. 6 is an enlarged view of a part of the gate array of FIG. 5. As shown in FIG. 6, the pads P2 in the internal pad area 2b are alternately connected to either the power source layer 6 or the ground layer 7. These pads P2 are also connected to the pad P1 in the external pad area 2a via the I/O cell area 3.

Moreover, a portion of the pads P2 in the internal pad area 2b are connected to neither the power source layer 6 nor the ground layer 7, and are used for exchanging signals with the internal cell area 1 via the I/O cell area 3.

In order to prevent the power source layer 6 or the ground layer 7 of FIG. 5 from a short circuit to the wiring layer 4, for example, a column part of the power source layer 6 or the ground layer 7 is formed on a first layer, a row part thereof is formed on a second layer, and the wiring layer 4 is formed on a third layer.

Moreover, when the wiring layer 4 for connecting the internal pad area 2b and the I/O cell area 3 is formed on the same layer (e.g., the third layer) as a wiring layer in the internal cell area 1, a new wiring layer for the internal pad area 2b becomes unnecessary, which can simplify the manufacture process.

Figure 7:
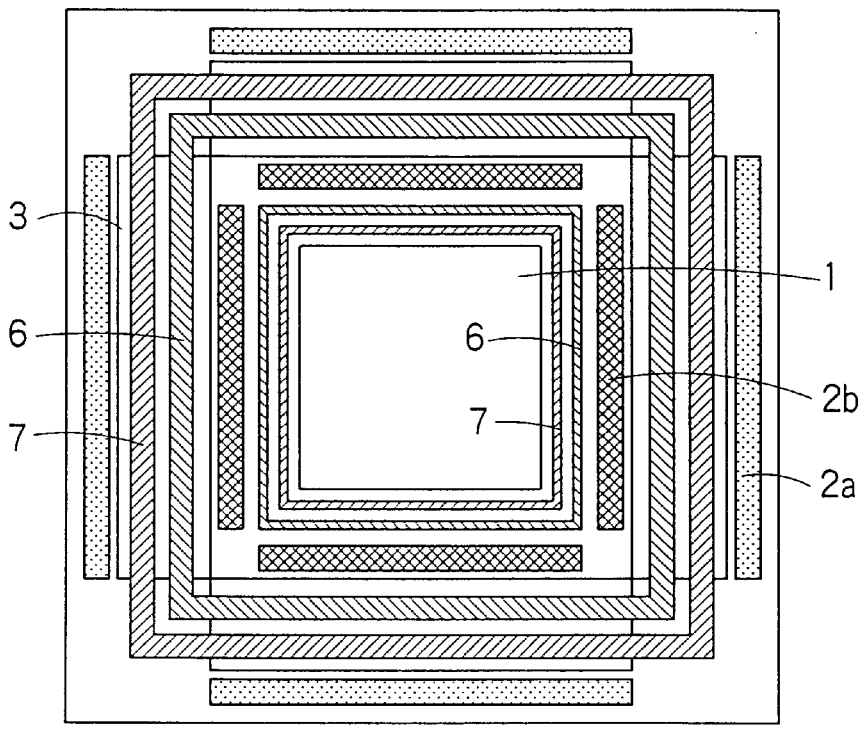
FIG. 7 is a diagram showing an example in which a power source layer 6 and an ground layer 7 are formed in an annular shape in an I/O cell area 3.
Figure 8:
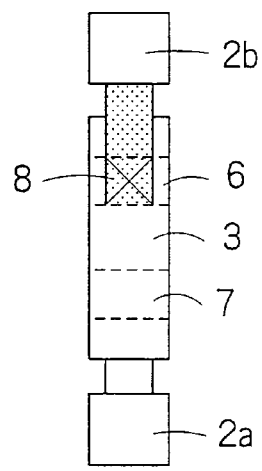
FIG. 8 is an enlarged view of a part of FIG. 7.

FIG. 7 is a diagram showing an example in which the power source layer 6 and the ground layer 7 are formed in an annular shape in the I/O cell area 3. Moreover, FIG. 8 is an enlarged view of a part of FIG. 7.

The power source layer 6 and the ground layer 7 in the I/O cell area 3 are formed, for example, on the same layer as the wiring layer on the second layer. To place the internal pad area 2b in contact with the power source layer 6 in the I/O cell area 3, as shown in FIG. 8, the internal pad area 2b and the I/O cell area 3 are interconnected in the wiring layer 4 on the third layer, and a contact is established with the power source layer 6 on the second layer through a via hole 8 in the I/O cell area 3. Thereby, the internal pad area 2b can be connected to the power source layer 6 or the ground layer 7 without placing a dedicated wiring layer.

As described above, in the first embodiment, since not only the pad area 2 is disposed outside the I/O cell area 3, but also the internal pad area 2b is disposed between the I/O cell area 3 and the internal cell area 1, the number of pads for external connection can be increased more than before, resulting in increase of the number of pins. Moreover, since the pad interval does not need to be narrowed, the manufacturing reliability is improved, and the manufacturing yield is raised.

(Second Embodiment)

In a second embodiment, the internal pad area 2b is formed in a part of the internal cell area 1.

FIG. 9 shows a layout of the second embodiment of the gate array. The gate array of FIG. 9 is common to that of FIG. 2 in that the internal pad area 2b is formed between the internal cell area 1 and the I/O cell area 3, but different from FIG. 2 in that the internal pad area 2b is formed in the internal cell area 1. The internal pad area 2b of FIG. 9 is formed to the inside along the outer edge in the internal cell area 1.

For the gate array of FIG. 9, in a similar manner as FIG. 3, the pad interval in the external pad area 2a is set to be narrower than the pad interval in the internal pad area 2b, and the pads P1, P2 and the internal cell area 1 are interconnected via the I/O cell area 3.

Moreover, the pads in the internal pad area 2b of FIG. 9 may be connected to the power source layer or the ground layer in a similar manner as FIG. 6.

As described above, in the second embodiment, since the empty area in the internal cell area 1 is utilized, and a part of the internal cell area 1 is used to form the internal pad area 2b, the size of the I/O cell area 3 or the external pad area 2a does not need to be changed.

In the above-described embodiments, the example in which the internal pad area 2b is formed in four directions outside the internal cell area 1 has been described, but the internal pad area 2b may be formed only in two directions or one direction.

Furthermore, in the above-described embodiments, the example in which the pad interval in the internal pad area 2b is set to be wider than the pad interval in the external pad area 2a has been described, but conversely the pad interval may be set to be narrower or the same.

Additionally, in above-described embodiments, the example in which the internal pad area 2b is utilized mainly for the power source terminal and earth terminal has been described, but the pad area may be utilized for other purposes.

What is claimed is:

1. A semiconductor device comprising:

an internal cell area on which logic circuits can be formed;

a pad area on which a plurality of pads for connection to the outside are formed; and an I/O cell area via which signals are received/transmitted between said internal cell area and said pad area, said pad area comprising:

an external pad area formed outside said I/O cell area; and an internal pad area formed between said internal cell area and said I/O cell area.

2. The semiconductor device according to claim 1, wherein a wiring layer for connecting said internal cell area and said I/O cell area is formed so as to pass between adjacent pads in said internal pad area.

3. The semiconductor device according to claim 1 comprising a power source line area and an ground line area disposed between said internal pad area and said internal cell area, and formed so as to surround said internal cell area, at least part of a plurality of pads formed in said internal pad area being connected to said power source line area or said ground line area.

4. The semiconductor device according to claim 1, wherein a wiring layer for connecting said I/O cell area and said internal pad area is formed on the same layer as a wiring layer of said internal cell area.

5. The semiconductor device according to claim 1, wherein a power source line area and an ground line area formed so as to surround said internal cell area are disposed in said I/O cell area, and said power source line area and the ground line area are formed on a second or higher layer.

6. A semiconductor device comprising:

an internal cell area on which logic circuits can be formed;

a pad area on which a plurality of pads for connection to the outside are formed; and an I/O cell area via which signals are received/transmitted between said internal cell area and said pad area, said pad area including:

an external pad area formed outside said I/O cell area; and an internal pad area formed along an outer edge of said internal cell area and inside said internal cell area.

7. The semiconductor device according to claim 6, wherein a wiring layer for connecting said internal cell area and said I/O cell area is formed so as to pass between adjacent pads in said internal pad area.

8. The semiconductor device according to claim 6 comprising a power source line area and an ground line area disposed between said internal pad area and said internal cell area, and formed so as to surround said internal cell area, at least part of a plurality of pads formed in said internal pad area being connected to said power source line area or said ground line area.

9. The semiconductor device according to claim 6, wherein a wiring layer for connecting said I/O cell area and said internal pad area is formed on the same layer as a wiring layer of said internal cell area.

10. The semiconductor device according to claim 2, wherein a power source line area and an ground line area formed so as to surround said internal cell area are, disposed in said I/O cell area, and said power source line area and the ground line area are formed on a second or higher layer.

11. The semiconductor device according to claim 9, wherein when said internal pad area is connected to said power source line area or said ground line area, said I/O cell area and said internal pad area are interconnected in a wiring layer on an uppermost layer.

12. The semiconductor device according to claim 10, wherein when said internal pad area is connected to said power source line area or said ground line area, said I/O cell area and said internal pad area are interconnected in a wiring layer on an uppermost layer.

* * * * *